United States Patent
Huh et al.

(10) Patent No.: US 9,853,192 B2
(45) Date of Patent: Dec. 26, 2017

(54) APPARATUS AND METHOD FOR MANUFACTURING THIN FILM ENCAPSULATION

(71) Applicant: Samsung Display Co., Ltd., Yongin, Gyeonggi-Do (KR)

(72) Inventors: Myung-Soo Huh, Yongin (KR); Jeong-Ho Yi, Yongin (KR); Yong-Suk Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 35 days.

(21) Appl. No.: 13/973,954

(22) Filed: Aug. 22, 2013

(65) Prior Publication Data
US 2014/0179041 A1    Jun. 26, 2014

(30) Foreign Application Priority Data
Dec. 24, 2012 (KR) .................. 10-2012-0152501

(51) Int. Cl.
*H01L 33/52* (2010.01)
*H01L 51/52* (2006.01)
(Continued)

(52) U.S. Cl.
CPC ........ *H01L 33/52* (2013.01); *H01L 21/67207* (2013.01); *H01L 51/5253* (2013.01);
(Continued)

(58) Field of Classification Search
None
See application file for complete search history.

(56) References Cited

U.S. PATENT DOCUMENTS 7,408,192 B2 *   8/2008   Kang .................. H01L 27/3223
                                                                257/59
8,110,509 B2     2/2012   Yamazaki et al.
(Continued)

FOREIGN PATENT DOCUMENTS

JP    2002-088473       3/2002
JP    2002-234103 A     8/2002
(Continued)

OTHER PUBLICATIONS

EPO Search Report dated Apr. 10, 2014, for corresponding European Patent application 13190560.6, (7 pages).
(Continued)

*Primary Examiner* — Charles Garber
*Assistant Examiner* — Alia Sabur
(74) *Attorney, Agent, or Firm* — Lewis Roca Rothgerber Christie LLP

(57) ABSTRACT

An apparatus and method for manufacturing a thin film encapsulation includes: a first cluster configured to form a first inorganic layer on a display substrate using a sputtering process; a second cluster configured to form a first organic layer on the first inorganic layer on the display substrate using a monomer deposition process; and a third cluster configured to form a second inorganic layer on the first organic layer on the display substrate using a chemical vapor deposition (CVD) process or a plasma enhanced chemical vapor deposition (PECVD) process.

14 Claims, 4 Drawing Sheets

(51) Int. Cl.
*H01L 51/56* (2006.01)
*H01L 21/67* (2006.01)
*B05D 1/00* (2006.01)

(52) U.S. Cl.
CPC ................ *H01L 51/56* (2013.01); *B05D 1/60* (2013.01); *B05D 1/62* (2013.01); *H01L 51/5256* (2013.01)

(56) References Cited

U.S. PATENT DOCUMENTS

| | | |
|---|---|---|
| 2001/0015620 A1* | 8/2001 | Affinito .......................... 313/512 |
| 2003/0167612 A1* | 9/2003 | Kraus et al. .................. 29/25.02 |
| 2003/0203210 A1 | 10/2003 | Graff et al. |
| 2004/0040131 A1 | 3/2004 | Miyazaki et al. |
| 2005/0016462 A1 | 1/2005 | Yamazaki |
| 2005/0072358 A1* | 4/2005 | Katsuoka ............ C23C 18/1628 118/719 |
| 2005/0239232 A1* | 10/2005 | Sugai .................. C23C 14/564 438/99 |
| 2005/0239294 A1* | 10/2005 | Rosenblum .............. B05D 1/60 438/778 |
| 2006/0216951 A1 | 9/2006 | Moro et al. |
| 2007/0234963 A1* | 10/2007 | Hartig .......................... 118/729 |
| 2008/0261409 A1 | 10/2008 | Hoffmann et al. |
| 2009/0075411 A1* | 3/2009 | Yamazaki et al. .............. 438/29 |
| 2009/0169809 A1 | 7/2009 | Yokoyama et al. |
| 2009/0279179 A1 | 11/2009 | Tanaka |
| 2010/0087028 A1* | 4/2010 | Porthouse et al. .............. 438/61 |
| 2011/0114973 A1 | 5/2011 | Matsuda |
| 2014/0170785 A1 | 6/2014 | Kurita et al. |

FOREIGN PATENT DOCUMENTS

| | | |
|---|---|---|
| JP | 2010-77487 A | 4/2010 |
| KR | 10-2006-0036006 A | 4/2006 |
| KR | 10-0718555 B1 | 5/2007 |
| KR | 10-1055688 B1 | 8/2011 |
| WO | WO 2004/054325 A1 | 6/2004 |
| WO | WO 2006/041240 A1 | 4/2006 |
| WO | WO 2012/174550 A2 | 12/2012 |

OTHER PUBLICATIONS

EPO Office Action dated Sep. 27, 2016, for corresponding European Patent Application No. 13190560.6 (6 pages).

\* cited by examiner

APPARATUS AND METHOD FOR MANUFACTURING THIN FILM ENCAPSULATION

CROSS-REFERENCE TO RELATED PATENT APPLICATION

This application claims priority to and the benefit of Korean Patent Application No. 10-2012-0152501, filed on Dec. 24, 2012, in the Korean Intellectual Property Office, the disclosure of which is incorporated herein in its entirety by reference.

BACKGROUND

1. Field

The present invention relates to an apparatus and method for manufacturing a thin film encapsulation.

2. Description of the Related Art

Recently, electronic devices based on mobility are widely used. In addition to compact electronic devices such as mobile phones, tablet personal computers (PCs) have recently been widely used as such mobile electronic devices.

In order to support various functions, mobile electronic devices include a display apparatus to provide visual information such as images to users. As components for driving display devices become increasingly compact, the size of display devices in electronic devices relative to the overall size of the electronic devices is gradually increasing, and display devices which are bendable to an angle (e.g., a predetermined angle) from a planar state are also being developed.

When a flexible display device as described above is formed, a light emitting unit of the flexible display device may be encapsulated using multiple thin films to improve the lifespan of the display device. To conduct the encapsulation, encapsulation thin films may be formed, and the encapsulation thin films may be formed by alternately stacking organic layers and inorganic layers. The organic layers and the inorganic layers of the encapsulation thin film may be formed using various methods.

SUMMARY

Embodiments of the present invention provide an apparatus and method for manufacturing thin film encapsulation in which thicknesses of organic layers and inorganic layers may be adjusted, and vacuum pressures of various thin film deposition equipment may be maintained uniformly.

According to an aspect of the present invention, there is provided a thin film encapsulation manufacturing apparatus comprising: a first cluster configured to form a first inorganic layer on a display substrate using a sputtering process; a second cluster configured to form a first organic layer on the first inorganic layer on the display substrate using a monomer deposition process; and a third cluster configured to form a second inorganic layer on the first organic layer on the display substrate using a chemical vapor deposition (CVD) process or a plasma enhanced chemical vapor deposition (PECVD) process.

The first cluster, the second cluster, and the third cluster may each include a plurality of process chambers.

An order of the plurality of process chambers of the first cluster, the plurality of process chambers of the second cluster, and the plurality of process chambers of the third cluster may be arranged along one direction, and the first inorganic layer, the first organic layer, and the second inorganic layer may be respectively formed in respective process chambers in the same order.

At least one of the first cluster, the second cluster, or the third cluster may include a mask storage chamber.

The thin film encapsulation manufacturing apparatus may further include a fourth cluster coupled to the third cluster and configured to form a second organic layer on the second inorganic layer transported from the third cluster, by using a monomer deposition process.

The thin film encapsulation manufacturing apparatus may further include a fifth cluster coupled to the fourth cluster and configured to form a third inorganic layer on the second organic layer transported from the fourth cluster, by using a CVD method or a PECVD method.

The second cluster and the third cluster may be alternately installed.

The first cluster and the second cluster may respectively form the first inorganic layer and the first organic layer using a downward deposition method, and the third cluster may form the second inorganic layer using an upward deposition method.

The thin film encapsulation manufacturing apparatus may further include at least one of: a passage chamber between the first cluster and the second cluster and configured to transport the display substrate; or a turn module chamber configured to align an input direction of the display substrate.

A plurality of passage chambers may be coupled to opposing sides of the turn module chamber to couple the first cluster to the second cluster.

When the display substrate is transported, internal pressures of the first cluster and one of the plurality of passage chambers, internal pressures of one of the plurality of passage chambers and the turn module chamber, internal pressures of the turn module chamber and another passage chamber from among the plurality of passage chambers, or internal pressures of another passage chamber from among the plurality of passage chambers and the second cluster may be controlled to be substantially the same.

The thin film encapsulation manufacturing apparatus may further include at least one of: a passage chamber between the second cluster and the third cluster and configured to transport the display substrate; or a turn module chamber configured to align an input direction of the display substrate.

A plurality of passage chambers may be coupled to opposing sides of the turn module chamber to couple the second cluster to the third cluster.

When the display substrate is transported, internal pressures of the second cluster and one of the plurality of passage chambers, internal pressures of one of the plurality of passage chambers and the turn module chamber, internal pressures of the turn module chamber and another passage chamber from among the plurality of passage chambers, or internal pressures of another passage chamber from among the plurality of passage chambers and the third cluster may be controlled to be substantially the same.

The thin film encapsulation manufacturing apparatus may further include a loading cluster configured to receive the display substrate from the outside and transport the display substrate to the first cluster.

The thin film encapsulation manufacturing apparatus may further include an unloading cluster coupled to the third cluster and configured to remove the display substrate transported from the third cluster.

The unloading cluster may include a plurality of unloading chambers, and each of the unloading chambers may be configured to store one of a plurality of the display substrates entering the unloading cluster when it is determined that one of the plurality of the display substrates is not present in each of the unloading chambers.

The thin film encapsulation manufacturing apparatus may further include a turn module chamber coupled between the third cluster and the unloading cluster and configured to invert the display substrate that is drawn out from the third cluster.

According to another aspect of the present invention, there is provided a method of manufacturing a thin film encapsulation, the method comprising: forming a first inorganic layer on a display substrate using a sputtering process; forming a first organic layer on the first inorganic layer on the display substrate using a monomer deposition process; and forming a second inorganic layer on the first organic layer on the display substrate using a chemical vapor deposition (CVD) process or a plasma enhanced chemical vapor deposition (PECVD) process.

After forming the first organic layer, the display substrate may be inverted to form the second inorganic layer.

The first inorganic layer, the first organic layer, and the second inorganic layer may be respectively formed in a first cluster comprising a plurality of process chambers, a second cluster comprising a plurality of process chambers, and a third cluster comprising a plurality of process chambers.

An order of the plurality of process chambers of the first cluster, the plurality of process chambers of the second cluster, and the plurality of process chambers of the third cluster may be arranged along one direction, and the first inorganic layer, the first organic layer, and the second inorganic layer may be respectively formed in respective process chambers in the same order.

At least one of the first cluster, the second cluster, or the third cluster may include a mask storage chamber configured to store a mask.

The display substrate may be transported from the first cluster to the second cluster via at least one of: a passage chamber between the first cluster and the second cluster and configured to transport the display substrate; or a turn module chamber configured to align an input direction of the display substrate.

A plurality of passage chambers may be coupled to opposing sides of the turn module chamber to couple the first cluster to the second cluster.

When the display substrate is transported, internal pressures of the first cluster and one of the plurality of passage chambers, internal pressures of one of the plurality of passage chambers and the turn module chamber, internal pressures of the turn module chamber and another passage chamber from among the plurality of passage chambers, or internal pressures of another passage chamber from among the plurality of passage chambers and the second cluster may be controlled to be substantially the same.

The display substrate may be transported from the second cluster to the third cluster via at least one of: the passage chamber coupled between the second cluster and the third cluster and configured to transport the display substrate; or a turn module chamber configured to align an input direction of the display substrate.

A plurality of passage chambers may be coupled to opposing sides of the turn module chamber to couple the second cluster to the third cluster.

When the display substrate is transported, internal pressures of the second cluster and one of the plurality of passage chambers, internal pressures of one of the plurality of passage chambers and the turn module chamber, internal pressures of the turn module chamber and another passage chamber from among the plurality of passage chambers, or internal pressures of another passage chamber from among the plurality of passage chambers and the third cluster may be controlled to be substantially the same.

The forming of a first organic layer and the forming of a second inorganic layer may be performed alternately a plurality of times.

The first inorganic layer and the first organic layer may be formed using a downward deposition method, and the second inorganic layer may be formed using an upward deposition method.

After forming the inorganic layer and the first organic layer, the display substrate may be inverted to form the second inorganic layer.

The method may further include, before forming the first inorganic layer, receiving the display substrate from the outside via a loading cluster.

The method may further include, after forming the second inorganic layer, removing the display substrate through an unloading cluster.

The unloading cluster may include a plurality of unloading chambers, and each of the unloading chambers may be configured to store one of a plurality of the display substrates entering the unloading cluster when it is determined that one of the plurality of display substrates is not present in each of the unloading chambers.

Before entering the unloading cluster, the display substrate may be inverted.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Hereinafter, embodiments of the present invention will be described more fully with reference to the accompanying drawings. The inventive concept may, however, be embodied in many different forms and should not be construed as limited to the exemplary embodiments set forth herein. Rather, these embodiments are provided so that this disclosure will be thorough and complete, and will fully convey the scope of the invention to those of ordinary skilled in the art. The terminology used herein is for the purpose of describing particular embodiments only and is not intended to be limiting of the inventive concept. As used herein, the singular forms 'a', 'an', and 'the' are intended to include the plural forms as well, unless the context clearly indicates otherwise. It will be further understood that the terms "comprises' and/or 'comprising,' when used in this specification, specify the presence of stated features, integers, operations, elements, and/or components, but do not preclude the presence or addition of one or more other features, integers, operations, elements, components, and/or groups thereof. It will be understood that, although the terms 'first', 'second', 'third', etc., may be used herein to describe various elements, components, regions, layers and/or sections, these elements, components, regions, layers and/or sections should not be limited by these terms. These terms are only used to distinguish one element, component, region, layer or section from another region, layer or section.

As used herein, the term "and/or" includes any and all combinations of one or more of the associated listed items. Expressions such as "at least one of," when preceding a list of elements, modify the entire list of elements and do not modify the individual elements of the list.

Figure 1:
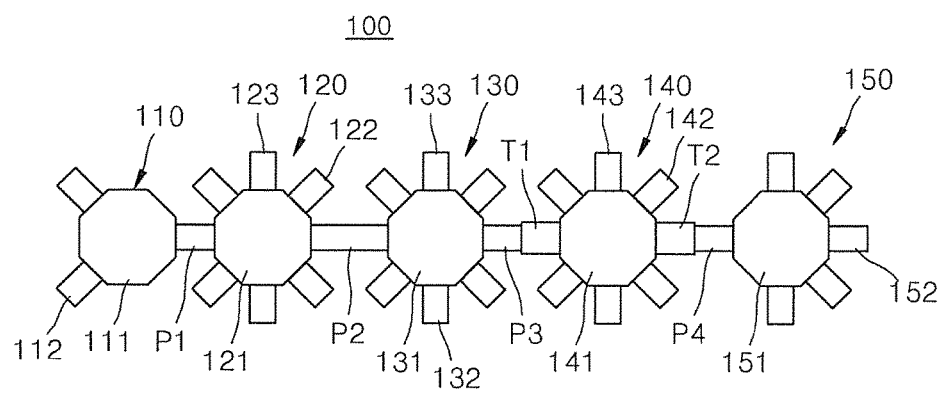
FIG. 1 is a conceptual diagram of a thin film encapsulation manufacturing apparatus according to an embodiment of the present invention.
Figure 2:
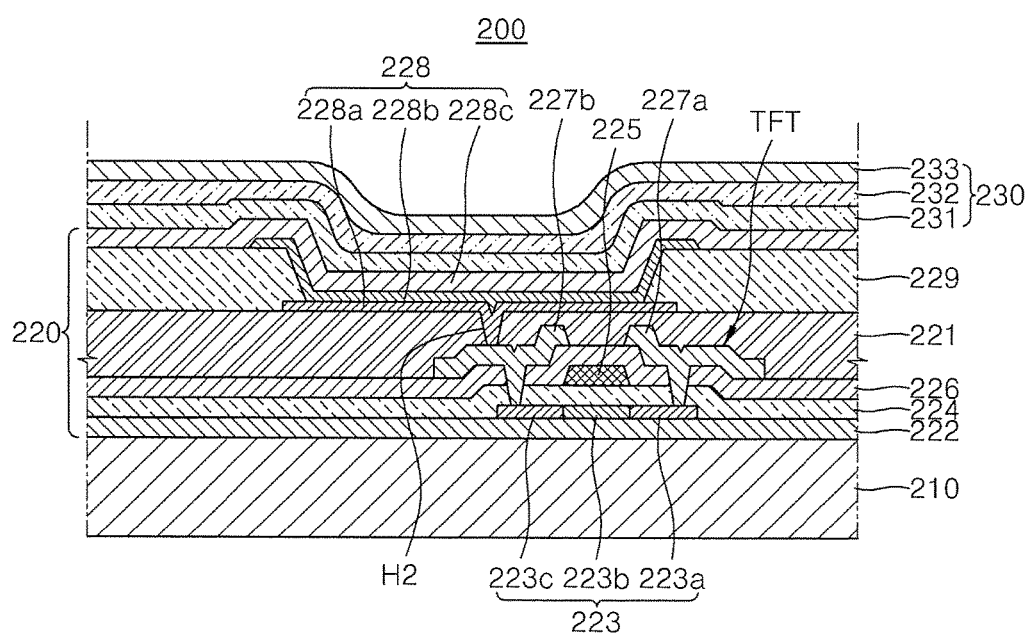
FIG. 2 is a cross-sectional view of a display substrate manufactured using the thin film encapsulation manufacturing apparatus of FIG. 1.

FIG. 1 is a conceptual diagram of a thin film encapsulation manufacturing apparatus 100 according to an embodiment of the present invention. FIG. 2 is a cross-sectional view of a display substrate 200 manufactured using the thin film encapsulation manufacturing apparatus 100 of FIG. 1.

Referring to FIGS. 1 and 2, the thin film encapsulation manufacturing apparatus 100 may include a loading cluster 110, a first passage chamber P1, a first cluster 120, a second passage chamber P2, a second cluster 130, a third passage chamber P3, a first turn module chamber T1, a third cluster 140, a second turn module chamber T2, a fourth passage chamber P4, and an unloading cluster 150.

The loading cluster 110 may receive the display substrate 200 from the outside and supply the display substrate 200 to the first cluster 120. The loading cluster 110 may include a loading chamber 112 that receives and stores the display substrate 200. A plurality of loading chambers 112 may be included, and each of the plurality of loading chambers 112 may store a display substrate 200. Also, the loading cluster 110 may include a first transfer chamber 111 coupled to the loading chamber 112. The plurality of loading chambers 112 may be respectively coupled to the first transfer chamber 111.

Meanwhile, the first passage chamber P1 may couple the loading cluster 110 and the first cluster 120. The first passage chamber P1 may be configured to transport the display substrate 200 from the loading cluster 110 to the first cluster 120.

The first cluster 120 may include a second transfer chamber 121. Also, the first cluster 120 may include a first sputtering chamber 122 that is coupled to the second transfer chamber 121 and is a process chamber for performing a sputtering process. Here, a plurality of first sputtering chambers 122 may be included, and the plurality of first sputtering chambers 122 may be respectively coupled to the second transfer chamber 121. In the first sputtering chamber 122, a first inorganic layer 231 may be deposited on the display substrate 200.

Alternatively, the first cluster 120 may include a first mask storage chamber 123 that stores a required mask during a sputtering process. Here, the first mask storage chamber 123 may store a mask, and then may automatically supply the mask to the first sputtering chamber 122.

Meanwhile, the second passage chamber P2 may couple the first cluster 120 and the second cluster 130, and may be configured to transport the display substrate 200 of the first cluster 120 to the second cluster 130.

The second cluster 130 may include a third transfer chamber 131 that temporarily stores the display substrate 200 that is transported via the second passage chamber P2. Also, the second cluster 130 may include a first monomer deposition chamber 132 that is coupled to the third transfer chamber 131 and is a process chamber that is used in performing a monomer deposition process. Here, a plurality of first monomer deposition chambers 132 may be included, and each of the first monomer deposition chambers 132 may be coupled to the third transfer chamber 131. In the first monomer deposition chamber 132, a first organic layer 232 may be formed on the first inorganic layer 231.

Alternatively, the second cluster 130 may include a second mask storage chamber 133 that stores a required mask during a sputtering process. Here, the second mask storage chamber 133 may store a plurality of masks, and may supply the masks to the first monomer deposition chamber 132 according to necessity.

Meanwhile, the third passage chamber P3 and the first turn module chamber T1 may be coupled between the second cluster 130 and the third cluster 140. Here, the third passage chamber P3 is configured to transport the display substrate 200 from the second cluster 130 to the first turn module chamber T1, and the first turn module T1 may be formed in the form of a Flip chamber so as to reverse (e.g., flip or invert) and align the display substrate 200. For example, after performing downward deposition in the first cluster and the second cluster, the first turn module chamber reverses (e.g., flips or inverts) the display substrate up and down to perform upward deposition in the third cluster 140, thereby transporting the display substrate from the second cluster 130 to the third cluster 140.

The third cluster 140 may include a fourth transfer chamber 141 that is coupled to the first turn module chamber T1. Here, the fourth transfer chamber 141 may be coupled to a first chemical vapor chamber 142, which is a process chamber used to stack a second inorganic layer 233. A plurality of first chemical vapor chambers 142 may be included, and the plurality of the first chemical vapor chambers 142 may be radially arranged in the fourth transfer chamber 141 at various intervals (e.g., predetermined intervals).

The second inorganic layer 233 may be formed on the first chemical vapor chamber 142 by using a typical chemical vapor deposition (CVD) method or a plasma enhanced CVD (PECVD) method. However, for convenience of description, an embodiment in which the second inorganic layer 233 is formed in the first chemical vapor chamber 142 using a typical CVD method will be described in detail.

The third cluster 140 may be coupled to the fourth transfer chamber 141, and may include a third mask storage chamber 143 that supplies masks that are required in the first chemical vapor chamber 142. Here, the third mask storage chamber 143 may store masks required in processes, and then supply the same to each of the first chemical vapor chambers 142 in which the processes are performed.

Meanwhile, the second turn module T2 may be coupled to the third cluster 140 formed as described above. The second turn module chamber T2 may be coupled to the fourth transfer chamber 141 and is configured to transport the display substrate 200, regarding which a process is completed, by reversing (e.g., flipping or inverting) the same. In detail, the second turn module chamber T2 may be formed as a Flip chamber like the first turn module chamber T1 described above.

The fourth transfer chamber P4 may be coupled to the second turn module chamber T2. The fourth transfer chamber P4 may be configured to transport the display substrate 200, regarding which a thin film encapsulation process is completed, to the unloading cluster 150.

The unloading cluster 150 may include a fifth transfer chamber 151. Also, the unloading cluster 150 may include an unloading chamber 152 that is coupled to the fifth transfer chamber 151 and is configured to transport the display substrate 200 from the fifth transfer chamber 151 to the outside. Here, a plurality of unloading chambers 152 may be included, and the plurality of unloading chambers 152 may be radially installed in or coupled to the fifth transfer chamber 151.

Meanwhile, hereinafter, a method of performing a thin film encapsulation process by using the thin film encapsulation manufacturing apparatus 100 and a structure of the display substrate 200 will be described in detail.

First, the display substrate 200 may be manufactured. In detail, the display substrate 200 may include a first substrate 210, and a light emitting unit 220.

The light emitting unit 220 may be formed on the first substrate 210. Here, the light emitting unit 220 includes a thin film transistor (TFT), and a passivation layer 221 covering (e.g., formed on) the TFT, and an organic light emitting device (OLED) may be formed on the passivation layer 221.

The first substrate 210 may be formed of a glass material, but is not limited thereto, and may also be formed of a plastic material, or a metal material such as steel use stainless (SUS) or titanium (Ti).

A buffer layer 222 formed of an organic compound and/or inorganic compound may be further formed on an upper surface of the first substrate 210 and of, for example, $SiO_x$ ($x \geq 2.1$) or $SiN_x$ ($x \geq 1$).

After an active layer 223 arranged in a pattern (e.g., a predetermined pattern) is formed on the buffer layer 222, and a gate insulating layer 224 is formed on the active layer 223 and the buffer layer 222. The active layer 223 includes a source region 223a and a drain region 223c, and further includes a channel area 223b therebetween. The active layer 223 may be formed of amorphous silicon, but is not limited thereto, and may also be formed of an oxide semiconductor. Examples of the oxide semiconductor may include an oxide of a material selected from the group consisting of 12, 13, and 14 Group metal elements such as zinc (Zn), indium (In), gallium (Ga), tin (Sn), cadmium (Cd), germanium (Ge), hafnium (Hf), and a combination of two or more of these. For example, the active layer 223 formed of a semiconductor may include G-I—Z—O—[$(In_2O_3)a(Ga_2O_3)b(ZnO)c$] (a, b, and c are real numbers that satisfy conditions of $a \geq 0$, $b \geq 0$, and $c \geq 0$). However, for convenience of description, the description below will focus on the active layer 223 formed of amorphous silicon.

The active layer 223 may be formed by first forming an amorphous silicon layer on the buffer layer 222, crystallizing the amorphous silicon layer to a polycrystalline silicon layer, and patterning the polycrystalline silicon layer. The active layer 223 may include source and drain areas 223a and 223c with impurities according to TFT types whether the TFT is a driving TFT (not shown) or a switching TFT (not shown).

A gate electrode 225 corresponding to the active layer 223 and an interlayer insulating layer 226 covering the gate electrode 225 are formed on the gate insulating layer 224.

A contact hole is formed through the interlayer insulating layer 226 and the gate insulating layer 224, and a source electrode 227a and a drain electrode 227b are formed on the interlayer insulating layer 226, extending through the interlayer insulating layer 226 and the gate insulating layer 224, so as to respectively contact the source region 223a and the drain region 223c.

Meanwhile, as a reflective layer is formed on the source/drain electrodes 227a and 227b at the same time as described above, the source/drain electrodes 227a and 227b may be formed of highly electrically conductive materials with a thickness at which light reflection is possible. For example, the source/drain electrodes 227a and 227b may be formed of a metal material such as silver (Ag), magnesium (Mg), aluminum (Al), platinum (Pt), palladium (Pd), gold (Au), nickel (Ni), neodymium (Nd), iridium (Ir), chromium (Cr), (lithium) Li, calcium (Ca) or a compound of two or more of these.

The passivation layer 221 is formed on the TFT and the reflective layer formed as described above, and a pixel electrode 228a of the OLED is formed on the passivation layer 221. The pixel electrode 228a contacts the drain electrode 227b of the TFT through a via hole H2 formed in the passivation layer 221. The passivation layer 221 may be formed of an inorganic material and/or an organic material, and in a single-layer structure or a structure including at least two layers, and may also be formed as a planarization layer such that an upper surface thereof is planarized regardless of curves of a lower layer. In addition, the passivation layer 221 may be formed of a transparent insulating material so as to obtain resonating effects.

After forming the pixel electrode 228a on the passivation layer 221, a pixel defining layer 229 may be formed to cover the pixel electrode 228a and the passivation layer 221 of an organic material and/or an inorganic material. The pixel defining layer 229 is opened so as to expose the pixel electrode 228a. That is, a portion of the pixel defining layer 229 over the pixel electrode 228a may be etched or removed to expose a portion of a surface of the pixel electrode 228a.

In addition, an organic layer 228b and an opposite electrode 228c are formed at least on the pixel electrode 228a.

The pixel electrode 228a may function as an anode electrode, and the opposite electrode 228c may function as a cathode electrode, and the polarities of the pixel electrode 228a and the opposite electrode 228c may be exchanged.

The pixel electrode 228a may be formed of a material having a high work function, for example, a transparent conductor such as indium tin oxide (ITO), indium zinc oxide (IZO), $In_2O_2$, and ZnO.

The opposite electrode 228c may be formed of a metal such as Ag, Mg, Al, Pt, Pd, Au, Ni, Nd, Ir, Cr, Li, Ca and a compound or alloy of two or more of these; in detail, the opposite electrode 228c may be formed of Mg, Ag, or Al with a thin thickness so as to be a semi-transmissive reflective layer so that light may be transmitted therethrough after optical resonance. The pixel electrode 228a and the opposite electrode 228c are electrically insulated from each other by the organic layer 228b, and light emission is performed in an organic emissive layer by applying voltages of opposite polarities to the organic layer 228b.

The organic layer 228b may be formed of a low-molecular or polymer organic layer. When formed of a low-molecular layer, the organic layer 228b may have a structure in which a hole injection layer (HIL), a hole transport layer (HTL), an organic emissive layer (EML), an electron transport layer (ETL), and an electron injection layer (EIL) are stacked in a single-layer or multi-layer structure, and various organic materials such as copper phthalocyanine (CuPc), N,N'-Di (naphthalene-1-yl)-N,N'-diphenyl-benzidine (NPB), tris-8-hydroxyquinoline aluminum (Alq3) may be used. The low-molecular organic layers may be formed using a vacuum deposition method. Here, the HIL, the HTL, the ETL, and the EIL are common layers which may be commonly applied to red, green, and blue pixels. Accordingly, the common layers may be formed to cover the entire pixels like the opposite electrode 228c.

For example, a polymer organic layer may be typically formed of a HTL and an EML, and here, PEDOT may be used as the HTL, and a polymer organic material such as poly-phenylenevinylene based material or a polyfluorene based material is used as an organic emissive layer, which may be formed by screen printing, inkjet printing, fine metal mask process, laser thermal transfer process, or the like.

Meanwhile, the organic emissive layer as described above may be formed in various forms. For example, a blue organic emissive layer, a green organic emissive layer, and a red organic emissive layer may be formed in each sub-pixel to form a single unit pixel. Also, besides the blue, green, and red organic emissive layers as described above, organic emissive layers of other colors may also be formed in a sub-pixel. Additionally, besides the blue, green, and red organic emissive layers, the blue organic emissive layer, the green organic emissive layer, and the red organic emissive layer may be stacked to form a white organic emissive layer as a sub-pixel, thereby forming a single unit pixel.

Moreover, while an organic emissive layer formed of an additional light emitting material in each pixel is described above, the embodiments of the present invention are not limited thereto. For example, an organic emissive layer may be formed commonly for the entire pixels regardless of locations of the pixels. Here, the organic emissive layer may be formed by vertically stacking an emissive material that emits, for example, red, green, and blue light, or by mixing the emissive materials. Obviously, if white light may be emitted, combination of other colors is also possible. Also, a color conversion layer or a color filter that converts the emitted white light to another color (e.g., a predetermined color) may be further included.

The organic layer 228b is not limited thereto, and other various examples of the organic layer 228b may also be applied. However, for convenience of description, the description below will focus on a sub-pixel formed of a blue organic emissive layer, a green organic emissive layer, and a red organic emissive layer to form a single unit pixel.

Meanwhile, after preparing the first substrate 210, on which the light emitting unit 220 is formed, the first substrate 210 may be input to the thin film encapsulation manufacturing apparatus 100 to form an encapsulation unit 230. The encapsulation unit 230 may be formed by sequentially stacking the first inorganic layer 231, the first organic layer 232, and the second inorganic layer 233 as described above.

In detail, the first organic layer 232 may be formed of a polymer, and may be a single layer or a stack layer formed one of polyethylene terephthalate, polyimide, polycarbonate, epoxy, polyethylene and polyacrylate. In one embodiment, the first organic layer 232 may be formed of polyacrylate; in detail, the first organic layer 232 may include a monomer composition including diacrylate monomer and triacrylate monomer. The monomer composition may further include monoacrylate monomer. Also, a photo-initiator well known in the art such as a thermoplastic polyolefin (TPO) may be further included in the monomer composition, but the embodiments of the present invention are not limited thereto.

The first inorganic layer 231 and the second inorganic layer 233 may be a single layer or a stack layer including a metal oxide or a metal nitride. In detail, the first inorganic layer 231 and the second inorganic layer 233 may include one of $SiN_x$, $Al_2O_3$, $SiO_2$, and $TiO_2$. Here, the second inorganic layer 233 may be formed to prevent or reduce moisture permeation with respect to the light emitting unit 220.

Meanwhile, a metal halide layer including LiF may be further included between the light emitting unit 220 and the first organic layer 231. The metal halide layer may prevent or reduce damage to the light emitting unit 220 when forming the first inorganic layer 231 by using a sputtering process.

Also, the first organic layer 232 is characterized in that it has a smaller surface than the second inorganic layer 233. Here, the first organic layer 232 is completely covered by the second inorganic layer 233.

A method of forming the encapsulation unit 230 as described above will be described in detail. First, the first substrate 210 on which the light emitting unit 220 is formed may be loaded into to a loading chamber 112 (shown in FIG. 1). Here, various loading methods may be used. For example, the first substrate 210 on which the light emitting unit 220 is formed may be loaded into a cassette, and then the cassette may be loaded into the loading chamber 112. Also, the first substrate 210 on which the light emitting unit 220 is formed may be supplied (e.g., loaded or placed) into the loading chamber 112 by using a transport unit such as an external robot arm.

Meanwhile, the first substrate 210 that is supplied as described above may be supplied or transferred to the first transfer chamber 111 from the loading chamber 112. Here, a robot arm or the like may be installed in or coupled to the first transfer chamber 111 to move the first substrate 210. When transporting the first substrate 210 from the loading chamber 112 to the first transfer chamber 111, pressures of the loading chamber 112 and the first transfer chamber 111 may be adjusted to be the same before performing the transporting operation.

The first substrate 210 that is transported to the first transfer chamber 111 as described above may be transported again from the first transfer chamber 111 to the first passage chamber P1. Here, when transporting the first substrate 210, internal pressures of the first transfer chamber 111 and the first passage chamber P1 may be controlled to be uniform.

The first passage chamber P1 may transport the first substrate 210 to the second passage chamber 121 of the first cluster 120 again. Here, when transporting the first substrate 210, internal pressures of the first passage chamber P1 and the second transfer chamber 121 may be maintained uniformly or substantially uniformly.

The first substrate 210 that is transported as described above may be loaded into one of the plurality of first sputtering chambers 122 from the second transfer chamber 121. Here, a plurality of the first substrates 210 may be loaded into the first sputtering chambers 122 in a defined or predetermined be predetermined order (e.g., in a clockwise or counterclockwise direction). For example, the order of the plurality of first sputtering chambers 122 may be appointed in or arranged along a direction (e.g., a predetermined direction), such as a clockwise direction or a counterclockwise direction. Also, each of the first sputtering chambers 122 may be designated with an identification (ID). The method of determining the order is not limited thereto, and the order of the plurality of first sputtering chambers 122 may be determined using various methods. However, for convenience of description, the description below will focus on an embodiment in which the order is determined in a desired or predetermined direction.

The first substrates 210 may be loaded into the first sputtering chambers 122 which are numbered according to, for example, IDs given to the first substrates 210. For example, the first substrates 210 may be loaded into the first sputtering chambers 122 such that the IDs of the first substrates 210 and the order of the first sputtering chambers 122 are consistent.

When forming the first inorganic layer 231 by using a sputtering process as described above, a mask used in the sputtering process may be transported from the first mask storage chamber 123 to the first sputtering chambers 122 in which the sputtering process is to be performed. The mask may enter at least one of a plurality of first mask storage chambers 123. The order in which the mask enters may be, for example, such that the mask is transported to the first sputtering chamber 122 in which the sputtering process is to be performed, or before the first substrate 210 enters. Also, the embodiment of the present invention is not limited thereto, and the mask may enter at the same time with the first substrate 210.

Meanwhile, after the first substrate 210 has entered the first sputtering chamber 122, the first sputtering chamber 122 may form the first inorganic layer 231 on the light emitting unit 220. Here, the first inorganic layer 231 is the same as described above, and thus description thereof will be omitted.

When the first inorganic layer 231 is formed completely as described above, the first substrate 210 may be transported from the first sputtering chamber 122 to the second transfer chamber 121. Here, pressures of the first sputtering chamber 122 and the second transfer chamber 121 may be controlled to be the same.

The second transfer chamber 121 may transport the first substrate 210, on which the first inorganic layer 231 is formed, to the second passage chamber P2 by using, for example, a robot arm. For example, the first substrate 210 may be transported from the second transfer chamber 121 to the second passage chamber P2 while maintaining internal pressures of the second transfer chamber 121 and the second passage chamber P2 uniformly or substantially uniformly.

Meanwhile, the first substrate 210 that is transported as described above may be transported to the second cluster 130. Here, the first substrate 210 may be transported to the third transfer chamber 131 coupled to the second passage chamber P2, and when the first substrate 210 is transported, pressures of the second passage chamber P2 and the third transfer chamber 131 may be maintained the same or substantially the same.

As described above, the first substrate 210 transported to the third transfer chamber 131 may be transported to the first monomer deposition chamber 132 from the third transfer chamber 131. Here, the method of transporting the first substrate 210 to one of the plurality of first monomer deposition chambers 132 may be the same as the method of transporting the first substrate 210 to one of the plurality of first sputtering chambers 122 described above. For example, the plurality of first monomer deposition chambers 132 may be numbered in the same order as the plurality of first sputtering chambers 122.

The third transfer chamber 131 and the first monomer deposition chamber 132 may be set to have the same or substantially the same pressures. The first monomer deposition chamber 132 may form the first organic layer 232 on the first inorganic layer 231. In detail, when the first substrate 210 is loaded into the first monomer deposition chamber 132, monomer and a photoinitiator which may be polymerized by applying ultraviolet (UV) rays or heat may be deposited by using a flash evaporation method.

When the above process is completed, UV rays or heat may be applied to a surface on which the monomer is deposited and hardened, thereby polymerizing the monomer to form the first organic layer 232 in the form of a polymer. The first organic layer 232 is the same as described above, and thus description thereof will be omitted.

The mask used in forming the first organic layer 232 may be supplied to the first monomer deposition chamber 132 while being stored in the second mask storage chamber 133. Here, the method of supplying the mask from the second mask storage chamber 133 to the first monomer deposition chamber 132 is similar to the method of supplying a mask from the first mask storage chamber 123 to the first sputtering chamber 122, and thus, description thereof will be omitted.

Meanwhile, the first substrate 210 that is transported to the third transfer chamber 131 after forming the first organic layer 232 on the first inorganic layer 231 may be transported again from the third transfer chamber 131 to the third transfer chamber 131. Here, when transporting the first substrate 210, internal pressures of the third passage chamber P3 and the third transfer chamber 131 may be controlled to be the same.

When the above process is completed, the first substrate 210 may be supplied from the third transfer chamber 131 to the first turn module chamber T1. Here, the first turn module chamber T1 may reverse (e.g., flip or invert) the first substrate 210 by 180 degrees. In detail, in the case of the first cluster 120 and the second cluster 130, a downward deposition method is used, in which a deposition material is moved upwardly to deposit the first inorganic layer 231 and the first organic layer 232, and in the case of the third cluster 140, an upward deposition method is used, in which a deposition material is moved downwardly to deposit the second inorganic layer 233. Thus, for the upward deposition, the first substrate 210 may be reversed (e.g., flipped or inverted) by 180 degrees.

As described above, after reversing (e.g., flipping or inverting) the first substrate 210 in the first turn module chamber T1, the second substrate 210 may be supplied to the fourth transfer chamber 141. Here, internal pressures of the first turn module chamber T1 and the fourth passage chamber 141 may be controlled to be the same or substantially the same.

Meanwhile, the first substrate 210 transported to the fourth transfer chamber 141 may be transported to the first chemical deposition chamber 142 again. Here, internal pressures of the fourth transfer chamber 141 and the first chemical vapor chamber 142 may be controlled to be the same or substantially the same.

As described above, when the second inorganic layer 233 is deposited, a mask used in the first chemical vapor chamber 142 may be supplied from the third mask storage chamber 143. Here, an process of the third mask storage chamber 143 is similar to that of the first mask storage chamber 123 or the second mask storage chamber 133, and thus detailed description thereof will be omitted.

Meanwhile, when deposition of the second inorganic layer 233 is completed, the display substrate 200 on which the encapsulation unit 230 is formed may be transported from the fourth transfer chamber 141 to the second turn module chamber T2. Here, the second turn module chamber T2 may restore the display substrate 200 to an original state by reversing (e.g., flipping or inverting) the same by 180 degrees.

The display substrate 200 that is restored to an original state may be transported to the fifth transfer chamber 151 from the second turn module chamber T2 via the fourth passage chamber P4. Here, when the display substrate 200 is transported from the fourth passage chamber P4 to the fifth transfer chamber 151, the transportation may be conducted while maintaining internal pressures of the second turn module chamber T2 and the fourth passage chamber P4 uniform or substantially uniform, and then finally to the fifth transfer chamber 151 by maintaining internal pressures of the fourth passage chamber P4 and the fifth transfer chamber 151 uniformly or substantially uniformly.

When the above process is completed, the encapsulation unit 230 may be completely formed on the light emitting unit 220 so as to complete the manufacture of the display substrate 200. The display substrate 200 manufactured as described above may be loaded from the fifth transfer chamber 151 to the unloading chamber 152 and stored therein. Here, the display substrate 200 may be transported while internal pressures of the fifth transfer chamber 151 and the unloading chamber 152 are controlled to be the same.

Meanwhile, the completed display substrate 200 may be loaded into the unloading chamber 152 using various methods. For example, an order may be set for the unloading chamber 152 in advance, or if the display substrate 200 is completely loaded into the unloading chamber 152 that is randomly selected, the display substrate 200 may be controlled to be stored in another unloading chamber 152. Also, one display substrate 200 is stored in the unloading chamber 152, and if it is determined that there is no display substrate 200, a suitable display substrate 200 may be transported from the fifth transfer chamber 151. The suitable display substrate 200 may be selected randomly, or in a predetermined order.

Accordingly, the thin film encapsulation manufacturing apparatus 100 as described above may perform a thin film encapsulation process in an in-line type manner, and thus time used in the thin film encapsulation process may be optimized.

Also, the thin film encapsulation manufacturing apparatus 100 may adjust a thicknesses of respective layers when forming a multilayer thin film encapsulation, and as upward layer formation and downward layer formation may be performed at the same time, a multi-layer thin film encapsulation may be simply formed.

Because the thin film encapsulation manufacturing apparatus 100 includes the loading cluster 110 and the unloading cluster 150, a thin film encapsulation may be formed in an in-line process, thereby increasing productivity.

Figure 3:
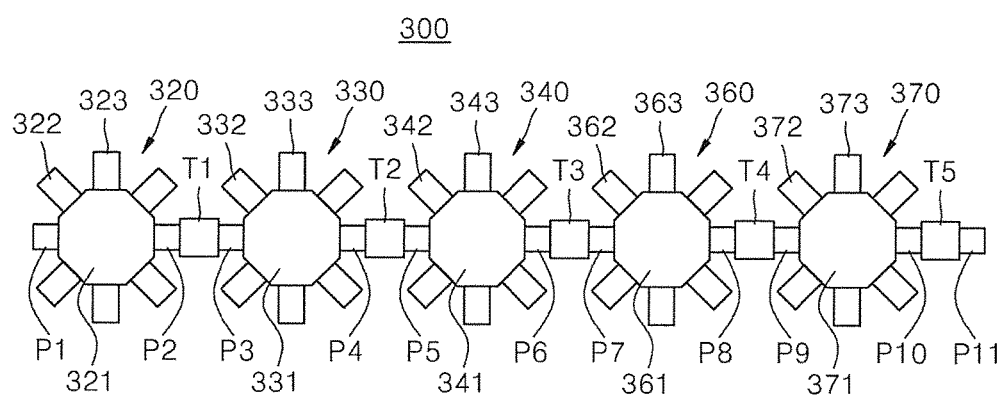
FIG. 3 is a conceptual diagram of a thin film encapsulation manufacturing apparatus according to another embodiment of the present invention.
Figure 4:
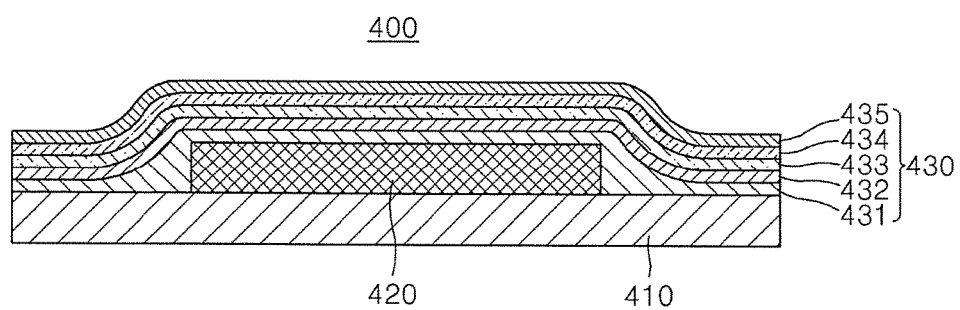
FIG. 4 is a cross-sectional view of a display substrate manufactured using the thin film encapsulation manufacturing apparatus of FIG. 3.

FIG. 3 is a conceptual diagram of a thin film encapsulation manufacturing apparatus 300 according to another embodiment of the present invention. FIG. 4 is a cross-sectional view of a display substrate 400 manufactured using the thin film encapsulation manufacturing apparatus 300 of FIG. 3.

Referring to FIGS. 3 and 4, the thin film encapsulation manufacturing apparatus 300 may include a loading cluster (not shown), a first passage chamber P1, a first cluster 320, a second passage chamber P2, a first turn module chamber T1, a third passage chamber P3, a second cluster 330, a fourth passage chamber P4, a second turn module chamber T2, a fifth passage chamber P5, a third cluster 340, a sixth passage chamber P6, a third turn module chamber T3, a seventh passage chamber P7, a fourth cluster 360, an eighth passage chamber P8, a fourth turn module chamber T4, a ninth passage chamber P9, a fifth cluster 370, a tenth passage chamber P10, a fifth turn module chamber T5, an eleventh passage chamber P11, and an unloading cluster (not shown).

The first through eleventh passage chambers P1 through P11 are formed in the same or similar manner as the first through fourth passage chambers P1 through P4 described above with reference to FIGS. 1 and 2, and the display substrate 400 may also be transported using the same or similar method, and thus, detailed description thereof will be omitted.

Also, the first through fifth turn module chambers T1 through T5 are formed in the same or similar manner as the first and second turn module chambers T1 and T2 described above with reference to FIGS. 1 and 2, and the display substrate 400 may also be transported in the same or similar method by aligning or reversing (e.g., flipping or inverting) the display substrate 400, and thus, detailed description thereof will be omitted.

Meanwhile, the loading cluster and the unloading cluster are formed in the same manner as described above with reference to FIGS. 1 and 2, and thus detailed description thereof will be omitted below. In addition, the loading cluster and the unloading cluster may be included or not included in the thin film encapsulation manufacturing apparatus 300, and thus, for convenience of description, the description below will focus on an embodiment in which the loading cluster and the unloading cluster are not included.

The first cluster 320 may include a second transfer chamber 321, a first sputtering chamber 322, and a first mask storage chamber 323. The first cluster 320 is formed in the same or similar manner as described above with reference to FIGS. 1 and 2, and thus detailed description thereof will be omitted.

Also, the second cluster 330 may include a third transfer chamber 331, a first monomer deposition chamber 332, and a second mask storage chamber 333. The second cluster 330 is formed in the same or similar manner as described above with reference to FIGS. 1 and 2, and thus detailed description thereof will be omitted.

The third cluster 340 may include a fourth transfer chamber 341, a first chemical vapor chamber 342, and a second mask storage chamber 343. The third cluster 340 is formed in the same or similar manner as described above with reference to FIGS. 1 and 2, and thus detailed description thereof will be omitted. However, for convenience of description, the description below will focus on an embodiment in which a second inorganic layer 433 is formed in the first chemical vapor chamber 342 using a PECVD method.

Meanwhile, the fourth cluster 360 may include a sixth transfer chamber 361, a second monomer deposition chamber 362, and a fourth mask storage chamber 363. Here, the fourth cluster 360 may form a second organic layer 434 on the second inorganic layer 433. The fourth cluster 360 may be formed in a similar manner as the second cluster 330, and the second organic layer 434 may be formed in the same manner as the first organic layer 432, and thus detailed description thereof will be omitted.

The fifth cluster 370 may include a seventh transfer chamber 371, a second chemical vapor chamber 372, and a fifth mask storage chamber 373. The fifth cluster 370 may form a third inorganic layer 435 on the second organic layer 434. The fifth cluster 370 may be formed in a similar manner as the third cluster 340, and the third inorganic layer 435 may be formed in the same manner as the second inorganic layer 433, and thus detailed description thereof will be omitted.

Meanwhile, hereinafter, a method of performing a thin film encapsulation process by using the thin film encapsulation manufacturing apparatus 300 and a structure of the display substrate 400 will be described in detail.

First, the display substrate 400 may be manufactured. In detail, the display substrate 400 may include a first substrate 410, an encapsulation unit 430, and a light emitting unit 420. Here, the first substrate 410 and the light emitting unit 420 are respectively the same as the first substrate 210 and the light emitting unit 220 described above with reference to FIGS. 1 and 2, and thus detailed description thereof will be omitted.

Meanwhile, after preparing the first substrate 410 on which the light emitting unit 420 is formed, the first substrate 410 may be loaded into or positioned inside the thin film encapsulation manufacturing apparatus 300 to form an encapsulation unit 430. Here, the encapsulation unit 430 may include at least one sandwich structure, in which at least one organic layer is inserted between at least two inorganic layers. Also, the encapsulation unit 430 may include a sandwich structure in which at least one inorganic layer is inserted between at least two organic layers.

The encapsulation unit 430 may be formed by sequentially stacking a first inorganic layer 431, the first organic layer 432, the second inorganic layer 433, the second organic layer 434, and the third inorganic layer 435 as described above.

In detail, the first organic layer 432 and the second organic layer 434 may be formed of a polymer, and may be a single layer or multiple layers formed one of polyethylene terephthalate, polyimide, polycarbonate, epoxy, polyethylene and polyacrylate. In one embodiment, the first organic layer 432 and the second organic layer 434 are formed of polyacrylate, and in detail, may include a monomer composition including diacrylate monomer and triacrylate monomer. The monomer composition may further include monoacrylate monomer. Also, a photo-initiator well known in the art such as a TPO may be further included in the monomer composition, but the embodiment of the present invention is not limited thereto.

The first through third inorganic layers 431, 433, and 435 may be a single layer or multiple layers including a metal oxide or a metal nitride. In detail, the first through third inorganic layers 431, 433, and 435 may include one of SiNx, $Al_2O_3$, $SiO_2$, and $TiO_2$. Here, the third inorganic layer 435 may be formed to prevent or reduce moisture permeation with respect to the light emitting unit 420.

Meanwhile, a metal halide layer including LiF may be further included between the light emitting unit 420 and the first inorganic layer 431. The metal halide layer may prevent or reduce damage to the light emitting unit 420 when forming the first inorganic layer 431 by using a sputtering process.

Also, the first organic layer 432 is characterized in that it has a smaller surface than the second inorganic layer 433, and the second organic layer 434 may also have a smaller surface area than the third inorganic layer 435. Also, the first organic layer 432 is characterized in that it is completely covered by the second inorganic layer 433, and the second organic layer 434 may also be completely covered by the third inorganic layer 435.

A method of forming the encapsulation unit 430 as described above will be described in detail. By maintaining a vacuum degree or pressure of the whole thin film encapsulation apparatus 300 at 5E-4 Pa or less, masks in the first through fifth mask storage chambers 323, 333, 343, 363, and 373, respectively, may be transferred between the first sputtering chamber 322, the first monomer deposition chamber 332, the first chemical vapor chamber 342, the second monomer deposition chamber 362, and the second chemical vapor chamber 372 using a robot arm.

When the above process is completed, the first substrate 410, on which the light emitting unit 420 is formed, is mounted in the first passage chamber P1, and a vacuum degree or pressure of the first passage chamber P1 is maintained at the same or substantially the same level as the second transfer chamber 321, and then a gate valve is opened so as to move the first substrate 410 to the second transfer chamber 321. Here, the first substrate 410 may be moved by using a robot.

Meanwhile, when the vacuum degree or pressure of the second transfer chamber 321 and that of one of the first sputtering chambers 322, in which a sputtering process for forming the first inorganic layer 431 is performed, are at the same level, a gate valve is opened so as to move or transfer the first substrate 410 to the first sputtering chamber 322. After being loaded between a previously mounted mask and a substrate holder, the first substrate 410 is aligned (e.g., precisely aligned) by using a mark of the first substrate 410 and an open mark of the mask by using an aligning instrument to which a vision unit is coupled, and then the first substrate 410 and the mask are adhered to each other.

Meanwhile, a process gas is injected into the first sputtering chamber 322 for a sputtering process to maintain a vacuum degree or pressure in a range of 1E-1 to 1E-2 Pa, and a voltage is applied to a cathode to generate plasma discharge. Here, layers are formed while transporting the first substrate 410 or the cathode inside the first sputtering chamber 322.

While the process is performed, when the first inorganic layer 431 reaches a target thickness, the first substrate 410 or the cathode is moved to a standby area to stop discharging, and a gas injecting operation is also stopped to control conductance of a vacuum discharge system so as to maintain the vacuum degree or pressure of the first sputtering chamber 322 at the same level as the second transfer chamber 321. Here, the first substrate 410 and the mask are detached from each other to move the first substrate 410 to a position where it may be ejected.

When the above process is completed, the first substrate 410 is moved from the first sputtering chamber 322 to the second transfer chamber 321. Also, when the vacuum degrees or pressures of the second transfer chamber 321 and the second passage chamber P2 are at the same or substantially the same level, the first substrate 410 is moved from the second transfer chamber 321 to the second passage chamber P2.

When the vacuum degrees or pressures of the second passage chamber P2 and the first turn module chamber T1 are at the same or substantially the same level, the first substrate 410 is moved to the first turn module chamber T1, and the first substrate 410 is rotated in the first turn module chamber T1 by 180 degrees so as to prevent or reduce a change in an input position of the first substrate 410.

Meanwhile, when the operation of the first turn module chamber T1 is completed, the vacuum degrees or pressures of the first turn module chamber T1 and the third passage chamber P3 are controlled to be the same or substantially the same, thereby moving the first substrate 410 to the third passage chamber P3.

Here, while maintaining the vacuum degrees or pressures of the third passage chamber P3 and the third transfer chamber 331 at the same or substantially the same level, a gate valve is opened so as to move the first substrate 410 to the third transfer chamber 331. Here, the first substrate 410 is moved by using a robot.

When the above process is completed, and the vacuum degree or pressure of the third transfer chamber 331 and that of one of the plurality of first monomer deposition chambers 332 are at the same or substantially the same level, in which a monomer deposition process of forming the first organic layer 432 is performed, the gate valve is opened so as to move the first substrate 410 to the first monomer deposition chamber 332. Here, after being loaded between a previously mounted mask and a substrate holder, the first substrate 410 is precisely aligned by using a mark of the first substrate 410 and an open mark of the mask by using an aligning instrument to which a vision unit is coupled, and then the first substrate 410 and the mask are adhered to each other.

A process gas for the monomer deposition process is injected into the first monomer deposition chamber 332, in which the monomer deposition process is performed, to maintain a vacuum degree or pressure in a range of 1E-1 to 1E-2 Pa, and a nozzle unit of a vaporizer containing an evaporated organic material is opened. Here, in the first monomer deposition chamber 332, layer formation and hardening are performed while transporting the first substrate 410 or a source unit.

As described above, when the first substrate 210 is loaded into the first monomer deposition chamber 332, a monomer and a photo-initiator which may be polymerized by applying UV rays or heat may be deposited by using a flash evaporation method.

When the above process is completed, UV rays or heat may be applied to a surface, on which the monomer is deposited, to harden the surface, thereby polymerizing the monomer to form the first organic layer 432 in the form of a polymer.

Meanwhile, while the above process is performed, when the first organic layer 432 reaches a target thickness, the first substrate 410 or the source unit is moved to a standby area to stop injection of the process gas, and conductance of a vacuum discharge system is controlled to maintain the vacuum degree or pressure of the first monomer deposition chamber 332 at the same or substantially the same level as that of the third transfer chamber 331. Here, the first substrate 410 and the mask are detached from each other to move the first substrate 410 to a position where it may be ejected or removed.

When the vacuum degrees or pressures of the first monomer deposition chamber 332 and the third transfer chamber 331 are at the same or substantially the same level, the first substrate 410 is moved from the first monomer deposition chamber 332 to the third transfer chamber 331. Also, when the vacuum degrees or pressures of the third transfer chamber 331 and the fourth passage chamber P4 are at the same or substantially the same level, the first substrate 410 is moved or transported from the third transfer chamber 331 to the fourth passage chamber P4.

Meanwhile, when the vacuum degrees or pressures of the fourth passage chamber P4 and the second turn module chamber T2 are at the same or substantially the same level, the first substrate 410 is moved to the second turn module chamber T2, and in the second turn module chamber T2, the first substrate 410 is rotated by approximately 180 degrees so as to prevent or reduce a change in an input position of the first substrate 410.

When the above process is completed, and when the vacuum degrees or pressures of the second turn module chamber T2 and the fifth passage chamber P5 are at the same or substantially the same level, the first substrate 410 is moved to the fifth passage chamber P5. Also, while maintaining the vacuum degrees or pressures of the fifth passage chamber P5 and the third cluster 340 at the same level, the gate valve is opened so as to move the first substrate 410 to the third cluster 340. The first substrate 410 may be moved from the fourth passage chamber P4 to the fourth transfer chamber 341. Here, the first substrate 410 is moved by using a robot.

As described above, when the vacuum degree or pressure of the fourth transfer chamber 341 and that of one of the plurality of first chemical vapor chambers 342, in which a PECVD method for forming the second inorganic layer 433 is performed, are at the same or substantially the same level by controlling a conductance of a vacuum discharge system by using a time spatial division method, the gate valve is opened so as to move the first substrate 410 to the first chemical vapor chamber 342. After being loaded between a previously mounted mask and a substrate holder, the first substrate 410 is precisely aligned by using a mark of the first substrate 410 and an open mark of the mask by using an aligning instrument to which a vision unit is coupled, and then the first substrate 410 and the mask are adhered to each other.

Next, after completely closing a valve for controlling conductance coupled to a high vacuum pump, Ar, which is a discharge gas, is injected by using a plasma generating unit to maintain a pressure in a range of 1 Pa to 200 Pa, and then power is increased to a power in a range of 3 W/cm$^2$ to 5 W/cm$^2$, thereby generating plasma.

Here, by supplying a reactive material, a reaction gas, and a transport gas by using a plasma generation source, a pressure in a range of 1 to 200 Pa is adjusted. The reactive material is injected into a plasma area to form a radical (SiN generation gas: SiH$_4$/NH$_3$/N$_2$/H$_2$/Ar is used). Then, in the above-described environment, a layer forming process is performed. Here, a layer formation speed is maintained at 200 nm/min or less, and a gas of SiR$_4$(50-500 sccm)/NH$_3$ (300-2000 sccm)/N$_2$(300-2000 sccm) is continuously supplied.

Meanwhile, while the above process is performed, and the second inorganic layer 433 reaches a target thickness, supply of a gas contributed to reaction is stopped, and plasma power is dropped in multiple stages to 1 W/cm$_2$. Then the first substrate 410 and the mask are detached from each other to move the first substrate 410 to a position where it may be ejected. At the same time, the valve for controlling conductance, installed at the high vacuum pump is opened by using a time division spatial control method, and then the vacuum degree or pressure of the first chemical vapor chamber 342 and that of the fourth transfer chamber 341 are maintained at the same level. Here, the first substrate 410 is moved from the first chemical vapor chamber 342 to the fourth transfer chamber 341.

Meanwhile, when the above process is completed, and the vacuum degrees or pressures of the fourth vacuum chamber 341 and the sixth passage chamber P6 are at the same or substantially the same level, the first substrate 410 is moved from the fourth vacuum chamber 341 to the sixth passage chamber P6.

Also, when the vacuum degrees or pressures of the sixth passage chamber P6 and the third turn module chamber T3 are at the same or substantially the same level, the first substrate 410 is moved to the third turn module chamber T3, and the first substrate 410 is rotated by 180 degrees in the third turn module chamber T3 so as to prevent or reduce a change in an input position of the first substrate 410.

Here, when the vacuum degrees or pressures of the third turn module chamber T3 and the seventh passage chamber P7 are at the same level, the first substrate 410 is moved to the seventh passage chamber P7. Also, while maintaining the vacuum degrees or pressures of the seventh passage chamber P7 and the sixth transfer chamber 361 at the same level, the gate valve is opened so as to move the first transport substrate 410 to the sixth transfer chamber 361. Here, the first substrate 410 is moved by using a robot.

Meanwhile, when the vacuum degree or pressure of the sixth transfer chamber 361 and that of one of a plurality of second monomer deposition chamber, in which a monomer deposition process for forming the second organic layer 434 is performed, are at the same or substantially the same level, the gate valve is opened so as to move the display substrate 200 to the second monomer deposition chamber 362. Here, the method of forming the second organic layer 434 is similar to the method of forming the first organic layer 432, and thus detailed description thereof will be omitted.

Meanwhile, when the second organic layer 434 reaches a target thickness, the first substrate 410 or the source unit is moved to a standby area to stop injection of a process gas, and the vacuum degree or pressure of the second monomer deposition chamber 362 is maintained at the same level as the sixth transfer chamber 361 by controlling conductance of a vacuum discharge system. Here, the first substrate 410 and the mask are detached from each other so as to move the first substrate 410 to a position where it may be ejected.

Meanwhile, after moving the first substrate 410 from the second monomer deposition chamber 362 to the sixth transfer chamber 361, when the vacuum degrees or pressures of the sixth transfer chamber 361 and the eighth passage chamber P8 are at the same or substantially the same level, the first substrate 410 is moved from the sixth transfer chamber 361 to the eighth passage chamber P8.

Again, when the vacuum degrees or pressures of the eighth passage chamber P8 and the fourth turn module chamber T4 are at the same level, the first substrate 410 is moved to the fourth turn module chamber T4, and the first substrate 410 is rotated by 180 degrees in the fourth turn module chamber T4 so as to prevent or reduce a change in an input position of the first substrate 410.

Also, when the above process is completed, and the vacuum degrees or pressures of the fourth turn module chamber T4 and the ninth passage chamber P9 are at the same level, the first substrate 410 is moved to the ninth passage chamber P9. Also, while maintaining the vacuum degrees or pressures of the ninth passage chamber P9 and the seventh transfer chamber 371 at the same or substantially the same level, the gate valve is opened so as to move the first transport substrate 410 to the seventh transfer chamber 371. Here, the first substrate 410 is moved by using a robot.

Meanwhile, when the above process is completed, and a vacuum degree or pressure of the seventh transfer chamber 371 and that of one of the plurality of second chemical vapor chambers 372, in which a PECVD method for forming the third inorganic layer 435 is performed, are at the same or substantially the same level by controlling conductance of a vacuum discharge system using a time spatial division method, the gate valve is opened so as to move the first substrate 410 to the second chemical vapor chamber 372. Here, the method of forming the third inorganic layer 435 after aligning the first substrate 410 and the mask is similar to the method of forming the second inorganic layer 233 described above, and thus detailed description thereof will be omitted.

Meanwhile, when the process is completed as the third inorganic layer 435 reaches a target thickness, the display substrate 400 and the mask are detached to move the display substrate 400 to a position where the display substrate 400 may be ejected or removed. At the same time, a valve for controlling conductance, installed in the high vacuum pump by a time spatial control method is opened, and then a vacuum degree or pressure of the second chemical vapor chamber 372 is maintained at the same or substantially the same level as the seventh transfer chamber 371.

When the above process is completed, the display substrate 400 is transported from the second chemical vapor chamber 372 to the seventh transfer chamber 371. Also, when the vacuum degrees or pressures of the seventh transfer chamber 371 and the tenth passage chamber P10 are at the same level, the display substrate 400 is moved from the seventh transfer chamber 371 to the tenth passage chamber P10.

Meanwhile, when the above process is completed, the display substrate 400 is transported from the tenth passage chamber P10 to the fifth turn module chamber T5, and the display substrate 400 may be aligned in the fifth turn module chamber T5 by rotating the same by 180 degrees, and then transported to the eleventh passage chamber P11.

Here, the user may complete the process by moving the display substrate 400 ejected from the eleventh passage chamber P11 to the outside. The display substrate 400 inside the eleventh passage chamber P11 may be taken out by using a robot.

As such, by using the thin film encapsulation manufacturing apparatus 300, thicknesses of the respective layers may be controlled when forming a stack multi-layer film layer using an organic layer and an inorganic layer, and an in-line type cluster may be formed by maintaining vacuum degrees or pressures of various thin film process equipment at the same level by using a time spatial division vacuum control method. In addition, as an in-line cluster is formed in the thin film encapsulation manufacturing apparatus 300, sputtering, flash deposition, and PECVD may be performed in an in-line manner.

Figure 5:
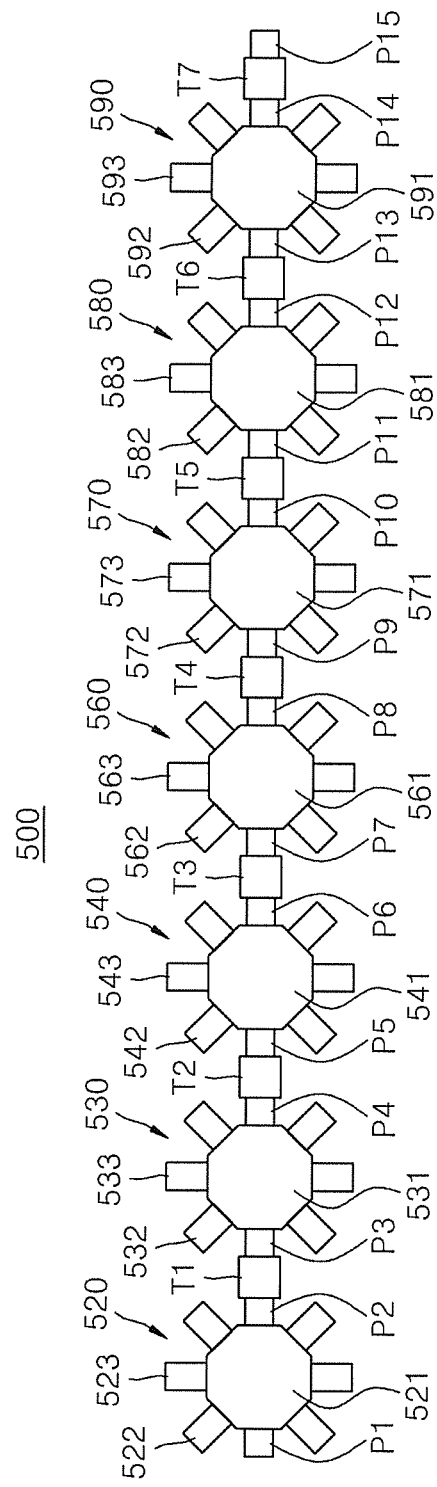
FIG. 5 is a conceptual diagram of a thin film encapsulation manufacturing apparatus according to another embodiment of the present invention.
Figure 6:
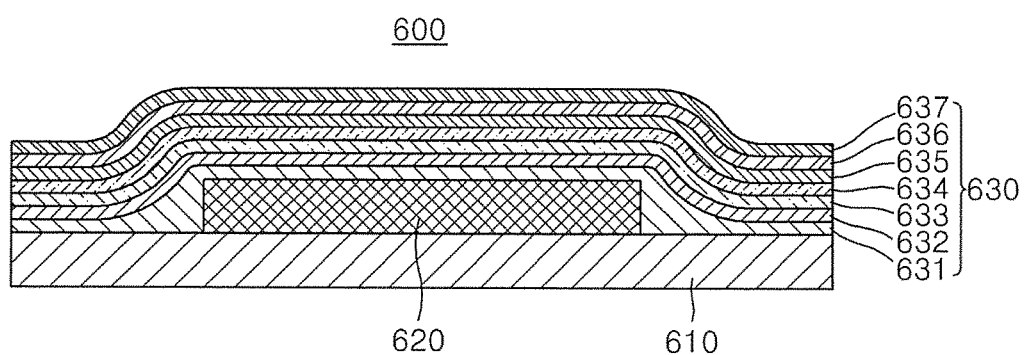
FIG. 6 is a cross-sectional view of a display substrate manufactured using the thin film encapsulation manufacturing apparatus of FIG. 5.

FIG. 5 is a conceptual diagram of a thin film encapsulation manufacturing apparatus 500 according to another embodiment of the present invention. FIG. 6 is a cross-sectional view of a display substrate 600 manufactured using the thin film encapsulation manufacturing apparatus 500 of FIG. 5.

Referring to FIGS. 5 and 6, the thin film encapsulation manufacturing apparatus 500 may include a loading cluster (not shown), a first passage chamber P1, a first cluster 320, a second passage chamber P2, a first turn module chamber T1, a third passage chamber P3, a second cluster 330, a fourth passage chamber P4, a second turn module chamber T2, a fifth passage chamber P5, a third cluster 340, a sixth passage chamber P6, a third turn module chamber T3, a seventh passage chamber P7, a fourth cluster 360, an eighth passage chamber P8, a fourth turn module chamber T4, a ninth passage chamber P9, a fifth cluster 370, a tenth passage chamber P10, a fifth turn module chamber T5, an eleventh passage chamber P11, a sixth cluster 580, a twelfth passage chamber P12, a sixth turn module chamber T6, a thirteenth passage chamber P13, a seventh cluster 590, a fourteenth passage chamber P14), a seventh turn module chamber T7, a fifteenth passage chamber P15, and an unloading cluster (not shown).

Here, the first through fifth passage chamber P1 through P15 are formed in the same or similar manner as the first through fourth passage chambers P1 through P4 described above with reference to FIGS. 1 and 2, and the display substrate 600 may be transported also in the same or similar method, and thus, detailed description thereof will be omitted.

Also, the first through seventh turn module chambers T1 through T7 are formed in the same or similar manner as the first and second turn module chambers T1 and T2 described above with reference to FIGS. 1 and 2, and the display substrate 600 may also be transported in the same or similar method by aligning or reversing (e.g., flipping or inverting) the same, and thus, detailed description thereof will be omitted.

Meanwhile, the loading cluster and the unloading cluster are formed in the same manner as described above with reference to FIGS. 1 and 2, and thus, detailed description thereof will be omitted below. In addition, the loading cluster and the unloading cluster may be included or not included in the thin film encapsulation manufacturing apparatus 500, and thus, for convenience of description, the description below will focus on an embodiment in which the loading cluster and the unloading cluster are not included.

The first cluster 520 may include a second transfer chamber 521, a first sputtering chamber 522, and a first mask storage chamber 523. The first cluster 520 is formed in the same or similar manner as described above with reference to FIGS. 1 and 2, and thus, detailed description thereof will be omitted.

Also, the second cluster 530 may include a third transfer chamber 531, a first monomer deposition chamber 532, and a second mask storage chamber 533. The second cluster 530 is formed in the same or similar manner as described above with reference to FIGS. 1 and 2, and thus, detailed description thereof will be omitted.

The third cluster 540 may include a fourth transfer chamber 541, a first chemical vapor chamber 542, and a third mask storage chamber 543. The third cluster 540 is formed in the same or similar manner as described above with reference to FIGS. 1 and 2, and thus, detailed description thereof will be omitted. However, for convenience of description, the description below will focus on an embodiment in which a second inorganic layer 633 is formed using a PECVD method in the first chemical vapor chamber 542.

Meanwhile, the fourth cluster 560 may include a sixth transfer chamber 561, a second monomer deposition chamber 562, and a fourth mask storage chamber 563. Here, the fourth cluster 560 may form a second organic layer 634 on the second inorganic layer 633. The fourth cluster 560 may be formed in a similar manner as the second cluster 530, and the second organic layer 634 may be formed in the same manner as the first organic layer 632, and thus, detailed description thereof will be omitted.

The fifth cluster 570 may include a seventh transfer chamber 571, a second chemical vapor chamber 572, and a fifth mask storage chamber 573. The fifth cluster 570 may form a third inorganic layer 635 on the second organic layer 634. The fifth cluster 570 may be formed in a similar manner as the third cluster 540, and the third inorganic layer 635 may be formed in the same manner as the second organic layer 233, and thus, detailed description thereof will be omitted.

Meanwhile, the sixth cluster 580 may include an eighth transfer chamber 581, a third monomer deposition chamber 582, and a sixth mask storage chamber 583. The sixth cluster 580 may form a third organic layer 636 on the third inorganic layer 635. The sixth cluster 580 may be formed in a similar manner as the second cluster 530, and the third organic layer 636 may be formed in the same manner as the first organic layer 632, and thus, detailed description thereof will be omitted.

The seventh cluster 590 may include a ninth transfer chamber 591, a third chemical vapor chamber 592, and a seventh mask storage chamber 593. The seventh cluster 590 may form a fourth inorganic layer 637 on the third organic layer 636. The seventh cluster 590 may be formed in a similar manner as the third cluster 540, and the fourth inorganic layer 637 may be formed in the same manner as the second inorganic layer 633, and thus, detailed description thereof will be omitted.

Meanwhile, hereinafter, a method of performing a thin film encapsulation process by using the thin film encapsulation manufacturing apparatus 500 and a structure of the display substrate 600 will be described in detail.

First, the display substrate 600 may be manufactured. In detail, the display substrate 600 may include a first substrate 610, an encapsulation unit 630, and a light emitting unit 620. Here, the first substrate 610 and the light emitting unit 620 are respectively the same as the first substrate 210 and the light emitting unit 220 described above with reference to FIGS. 1 and 2, and thus, detailed description thereof will be omitted.

Meanwhile, after preparing the first substrate 610 on which the light emitting unit 620 is formed, the first substrate 610 may be input to the thin film encapsulation manufacturing apparatus 500 to form the encapsulation unit 630. Here, the encapsulation unit 630 may include at least one sandwich structure, in which at least one organic layer is inserted between at least two inorganic layers. Also, the encapsulation unit 630 may include a sandwich structure, in which at least one inorganic layer is inserted between at least two organic layers.

For example, the encapsulation unit 630 may be formed by sequentially stacking a first inorganic layer 631, the first organic layer 632, the second inorganic layer 634, and the third inorganic layer 635, the third organic layer 636, and the fourth inorganic layer 637 as described above.

In detail, the first through third organic layers 632, 634, and 636 may be formed of a polymer, and may be a single layer or multiple layers formed one of polyethylene terephthalate, polyimide, polycarbonate, epoxy, polyethylene and polyacrylate. In one embodiment, the first through third organic layers 632, 634, and 636 may be formed of polyacrylate, and in detail, may include a monomer composition including diacrylate monomer and triacrylate monomer. The monomer composition may further include monoacrylate monomer. Also, a photo-initiator well known in the art such as a TPO may be further included in the monomer composition, but the embodiment of the present invention is not limited thereto.

The first through fourth inorganic layers 631, 633, 635, and 637 may be a single layer or a stack layer including a metal oxide or a metal nitride. In detail, the first through fourth inorganic layers 631, 633, 635, and 637 may include one of $SiNx$, $Al_2O_3$, $SiO_2$, and $TiO_2$. Here, the fourth inorganic layer 637 may be formed to prevent or reduce moisture permeation with respect to the light emitting unit 620.

Meanwhile, a metal halide layer including LiF may be further included between the light emitting unit 620 and the first inorganic layer 631. The metal halide layer may prevent or reduce damage to the light emitting unit 620 when forming the first inorganic layer 631 by using a sputtering process.

Also, the first organic layer 632 is characterized in that it has a smaller surface area than the second inorganic layer 633, and the second organic layer 634 may also have a smaller surface area than the third inorganic layer 635. The third organic layer 636 may also have a smaller surface area than the fourth inorganic layer 637.

Also, the first organic layer 632 is characterized in that it is completely covered by the second inorganic layer 633, and the second organic layer 634 may also be completely covered by the third inorganic layer 635. Also, the third organic layer 636 may be completely covered by the fourth inorganic layer 637.

A method of forming the encapsulation unit 630 as described above will be described in detail. By maintaining a vacuum degree or pressure of the whole thin film encapsulation apparatus 500 at 5E-4 Pa or less, masks in the first through fifth mask storage chambers 523, 533, 543, 563, and 573 may be moved or transported between and mounted in each of the first sputtering chamber 322, the first monomer deposition chamber 332, the first chemical vapor chamber 342, the second monomer deposition chamber 362, and the second chemical vapor chamber 372 using a robot arm.

When the above process is completed, the first inorganic layer 631, the first organic layer 632, the second inorganic layer 633, the second organic layer 634, and the third inorganic layer 635 may be formed on the light emitting unit 620. Here, the method of forming the first inorganic layer 631, the first organic layer 632, the second inorganic layer 633, the second organic layer 634, and the third inorganic layer 635 is the same as described above with reference to FIGS. 3 and 4, and thus, detailed description thereof will be omitted.

When the above process is completed, the first substrate 610 may be loaded into the sixth cluster 580 from the fifth cluster 570 after passing through the tenth passage chamber P10, the fifth turn module chamber T5, and the eleventh passage chamber P11.

Here, in the sixth cluster 580, the third organic layer 636 may be formed on the third inorganic layer 635 by using a flash deposition process. Here, the operational method of the sixth cluster 580 is similar to that of the second cluster 530 and the fourth cluster 560 described above, and thus, detailed description thereof will be omitted.

When the above process is completed, the first substrate 610 may be moved from the sixth cluster 580 to the seventh cluster 590 via the twelfth passage chamber P12, the sixth turn module chamber T6, and the thirteenth passage chamber P13.

Here, in the seventh cluster 590, the fourth inorganic layer 637 may be formed on the third organic layer 636. In the seventh cluster 590, the fourth inorganic layer 637 may be formed using a PECVD method. In the above case, the seventh cluster 590 operates in a similar manner as the third cluster 540 and the fifth cluster 570, and thus, detailed description thereof will be omitted.

As described above, after forming the fourth inorganic layer 637, the display substrate 600 may be drawn out from the seventh cluster 590 to the outside via the fourteenth passage chamber P14, the seventh turn module chamber T7, and the fifteenth passage chamber P15.

Meanwhile, the encapsulation unit 630 formed as described above is not limited thereto, and the first organic layer 632 and the second inorganic layer 633 may also be alternately formed on the first inorganic layer 631.

As such, by using the thin film encapsulation manufacturing apparatus 500, thicknesses of the respective layers may be controlled when forming a stack multi-layer film using an organic layer and an inorganic layer, and an in-line type cluster may be formed by maintaining vacuum degrees or pressures of various thin film process equipment at the same level by using a time spatial division vacuum control method. In addition, as an in-line cluster is formed in the thin film encapsulation manufacturing apparatus 500, sputtering, flash deposition, and PECVD may be performed in an in-line manner.

According to the embodiments of the present invention, when forming a multi-layer stack thin film of an organic layer and an inorganic layer, thicknesses of the respective layers may be controlled, and by maintaining vacuum degrees or pressures of various thin film manufacturing equipment uniformly using a time spatial division vacuum control method of a plasma chemical vapor deposition method, a cluster of an in-line type cluster may be formed. Also, according to the embodiments of the present invention, by forming an in-line type cluster, sputtering, flash deposition, and a plasma enhanced chemical vapor deposition (PECVD) may be conducted in an in-line manner.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A method of manufacturing a thin film encapsulation, the method comprising:
    forming, in a first cluster comprising a plurality of first process chambers, a first inorganic layer on an opposite electrode and a pixel defining layer of a display substrate using a sputtering process, the first inorganic layer contacting the opposite electrode;
    forming, in a second cluster comprising a plurality of second process chambers, a first organic layer on the first inorganic layer using a monomer deposition process; and
    inverting the display substrate after forming the first organic layer and forming, in a third cluster comprising a plurality of third process chambers, a second inorganic layer on the first organic layer using a chemical vapor deposition (CVD) process or a plasma enhanced chemical vapor deposition (PECVD) process,
    wherein an order of the plurality of first process chambers, the plurality of second process chambers, and the plurality of third process chambers are arranged along one direction, and the first inorganic layer, the first organic layer, and the second inorganic layer are formed in the first, second, and third process chambers, respectively, in the same order.

2. The method of claim 1, wherein at least one of the first cluster, the second cluster, or the third cluster comprises a mask storage chamber configured to store a mask.

3. The method of claim 1, wherein the display substrate is transported from the first cluster to the second cluster via at least one of:
    a passage chamber between the first cluster and the second cluster and configured to transport the display substrate; or
    a turn module chamber configured to align an input direction of the display substrate.

4. The method of claim 3, further comprising a plurality of passage chambers coupled to opposing sides of the turn module chamber to couple the first cluster to the second cluster.

5. The method of claim 4, wherein when the display substrate is transported, internal pressures of the first cluster and one of the plurality of passage chambers, internal pressures of one of the plurality of passage chambers and the turn module chamber, internal pressures of the turn module chamber and another passage chamber from among the plurality of passage chambers, or internal pressures of another passage chamber from among the plurality of passage chambers and the second cluster are controlled to be substantially the same.

6. The method of claim 3, wherein the display substrate is transported from the second cluster to the third cluster via at least one of:
the passage chamber that is coupled between the second cluster and the third cluster and configured to transport the display substrate; or
a turn module chamber configured to align an input direction of the display substrate.

7. The method of claim 6, further comprising a plurality of passage chambers coupled to opposing sides of the turn module chamber to couple the second cluster to the third cluster.

8. The method of claim 7, wherein when the display substrate is transported, internal pressures of the second cluster and one of the plurality of passage chambers, internal pressures of one of the plurality of passage chambers and the turn module chamber, internal pressures of the turn module chamber and another passage chamber from among the plurality of passage chambers, or internal pressures of another passage chamber from among the plurality of passage chambers and the third cluster are controlled to be substantially the same.

9. The method of claim 1, wherein the forming of a first organic layer and the forming of a second inorganic layer are performed alternately a plurality of times.

10. The method of claim 1, wherein the first inorganic layer and the first organic layer are formed using a downward deposition method, and the second inorganic layer is formed using an upward deposition method.

11. The method of claim 1, further comprising, before forming the first inorganic layer, receiving the display substrate from the outside via a loading cluster.

12. The method of claim 1, further comprising, after forming the second inorganic layer, removing the display substrate through an unloading cluster.

13. The method of claim 12, wherein the unloading cluster comprises a plurality of unloading chambers, and each of the unloading chambers is configured to store one of a plurality of the display substrates entering the unloading cluster when it is determined that one of the plurality of display substrates is not present in each of the unloading chambers.

14. The method of claim 12, wherein before entering the unloading cluster, the display substrate is inverted.

* * * * *